US011713066B2

(12) United States Patent
Harp et al.

(10) Patent No.: US 11,713,066 B2
(45) Date of Patent: Aug. 1, 2023

(54) RAILROAD CROSSING CONTROL SYSTEM INCLUDING CONSTANT WARNING TIME DEVICE AND AXLE COUNTER SYSTEM

(71) Applicant: Siemens Mobility, Inc., New York, NY (US)

(72) Inventors: Brian Harp, New Albany, IN (US); Holger Schmidt, Saint Johns, FL (US)

(73) Assignee: Siemens Mobility, Inc., New York, NY (US)

( * ) Notice: Subject to any disclaimer, the term of this patent is extended or adjusted under 35 U.S.C. 154(b) by 980 days.

(21) Appl. No.: 16/497,690

(22) PCT Filed: Mar. 29, 2017

(86) PCT No.: PCT/US2017/024688
§ 371 (c)(1),
(2) Date: Sep. 25, 2019

(87) PCT Pub. No.: WO2018/182588
PCT Pub. Date: Oct. 4, 2018

(65) Prior Publication Data
US 2020/0017134 A1 Jan. 16, 2020

(51) Int. Cl.
*B61L 29/32* (2006.01)
*B61L 29/22* (2006.01)
(Continued)

(52) U.S. Cl.
CPC ............... *B61L 29/32* (2013.01); *B61L 29/22* (2013.01); *B61L 29/282* (2013.01); *G01V 3/10* (2013.01)

(58) Field of Classification Search
CPC ........ B61L 29/22; B61L 29/282; B61L 29/32; G01V 3/10
See application file for complete search history.

(56) References Cited

U.S. PATENT DOCUMENTS

| 6,241,197 B1 * | 6/2001 | Harland | B61L 29/224 |
| | | | 701/19 |
| 2008/0169385 A1 * | 7/2008 | Ashraf | B61L 29/28 |
| | | | 246/130 |
| 2012/0138752 A1 * | 6/2012 | Carlson | B61L 3/02 |
| | | | 246/126 |

FOREIGN PATENT DOCUMENTS

| WO | 0191083 A1 | 11/2001 |
| WO | 2013170307 A1 | 11/2013 |

(Continued)

OTHER PUBLICATIONS

PCT International Search Report and Written Opinion of International Searching Authority dated Jun. 12, 2017 corresponding to PCT International Application No. PCT/US2017/024688 filed Mar. 29, 2017.

*Primary Examiner* — Robert J McCarry, Jr.

(57) ABSTRACT

A railroad crossing control system (100) includes a constant warning time device (40) with a control unit (50) configured to produce multiple signals, and a wheel sensing system (120) comprising at least one sensor (122) connected to a rail (20a, 20b) of a railroad track (20) at a predetermined position (P), wherein the wheel sensing system (120) detects a presence of railroad vehicle travelling on the railroad track (20) such that the at least one sensor (122) detects wheels of the railroad vehicle using electromagnetic fields, wherein the wheel sensing system (120) provides speed values of the railroad vehicle to the constant warning time device (40), and wherein the constant warning time device (40) produces a constant warning time signal for controlling a railroad crossing warning device in response to receiving the speed values of the wheel sensing system (120).

13 Claims, 3 Drawing Sheets

(51) Int. Cl.
*B61L 29/28* (2006.01)
*G01V 3/10* (2006.01)

(56) References Cited

FOREIGN PATENT DOCUMENTS

WO 2014/179028 A2 11/2014
WO 2016140899 A1 9/2016

* cited by examiner

RAILROAD CROSSING CONTROL SYSTEM INCLUDING CONSTANT WARNING TIME DEVICE AND AXLE COUNTER SYSTEM

BACKGROUND

1. Field

Aspects of the present invention generally relate to a railroad crossing control system including railroad signal control equipment comprising for example a constant warning time device and an axle counter system.

2. Description of the Related Art

Railroad signal control equipment includes for example a constant warning time device, also referred to as a grade crossing predictor (GCP) in the U.S. or a level crossing predictor in the U.K., which is an electronic device that is connected to the rails of a railroad track and is configured to detect the presence of an approaching train and determine its speed and distance from a crossing, i.e., a location at which the tracks cross a road, sidewalk or other surface used by moving objects. The constant warning time device will use this information to generate a constant warning time signal for controlling a crossing warning device. A crossing warning device is a device that warns of the approach of a train at a crossing, examples of which include crossing gate arms (e.g., the familiar black and white striped wooden arms often found at highway grade crossings to warn motorists of an approaching train), crossing lights (such as the red flashing lights often found at highway grade crossings in conjunction with the crossing gate arms discussed above), and/or crossing bells or other audio alarm devices. Constant warning time devices are typically configured to activate the crossing warning device(s) at a fixed time, also referred to as warning time (WT), which can be for example 30 seconds, prior to the approaching train arriving at a crossing.

Typical constant warning time devices include a transmitter that transmits a signal over a circuit formed by the track's rails and one or more termination shunts positioned at desired approach distances, also referred to as approach lengths, from the transmitter, a receiver that detects one or more resulting signal characteristics, and a logic circuit such as a microprocessor or hardwired logic that detects the presence of a train and determines its speed and distance from the crossing. The approach length depends on the maximum allowable speed (MAS) of a train, the desired WT, and a safety factor.

Termination shunts are mechanical devices connected between rails of a railroad track arranged at predetermined positions corresponding to the approach length required for a specific WT for the GCP system. Existing shunt devices may be secured onto the rails by clamp-type devices. However, a shunt device may not always be operational after its installation. For example, a shunt device may not be correctly clamped onto the rails, or an onsite worker may trip on a wire on the shunt device and disconnect it from the rails. Further, there is the possibility of a faulty connection or other error of the shunt device due to for example rusty rails or rusty connection elements of the shunts or material fatigue of shunt components.

SUMMARY

Briefly described, aspects of the present invention relate to a railroad crossing control system including railroad signal control equipment comprising for example a constant warning time device and an axle counter system.

An aspect of the present invention provides a railroad crossing control system comprising a constant warning time device with a control unit configured to produce multiple signals, and a wheel sensing system comprising at least one sensor connected to a rail of a railroad track at a predetermined position, wherein the wheel sensing system detects a presence of railroad vehicle travelling on the railroad track such that the at least one sensor detects wheels of the railroad vehicle using electromagnetic fields, wherein the wheel sensing system provides speed values of the railroad vehicle to the constant warning time device, and wherein the constant warning time device produces a constant warning time signal for controlling a railroad crossing warning device in response to receiving the speed values of the wheel sensing system.

DETAILED DESCRIPTION

To facilitate an understanding of embodiments, principles, and features of the present invention, they are explained hereinafter with reference to implementation in illustrative embodiments. In particular, they are described in the context of being a railroad crossing control system including a constant warning time device and an axle counter system comprising a wheel sensing system and an evaluation unit. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

Figure 1:
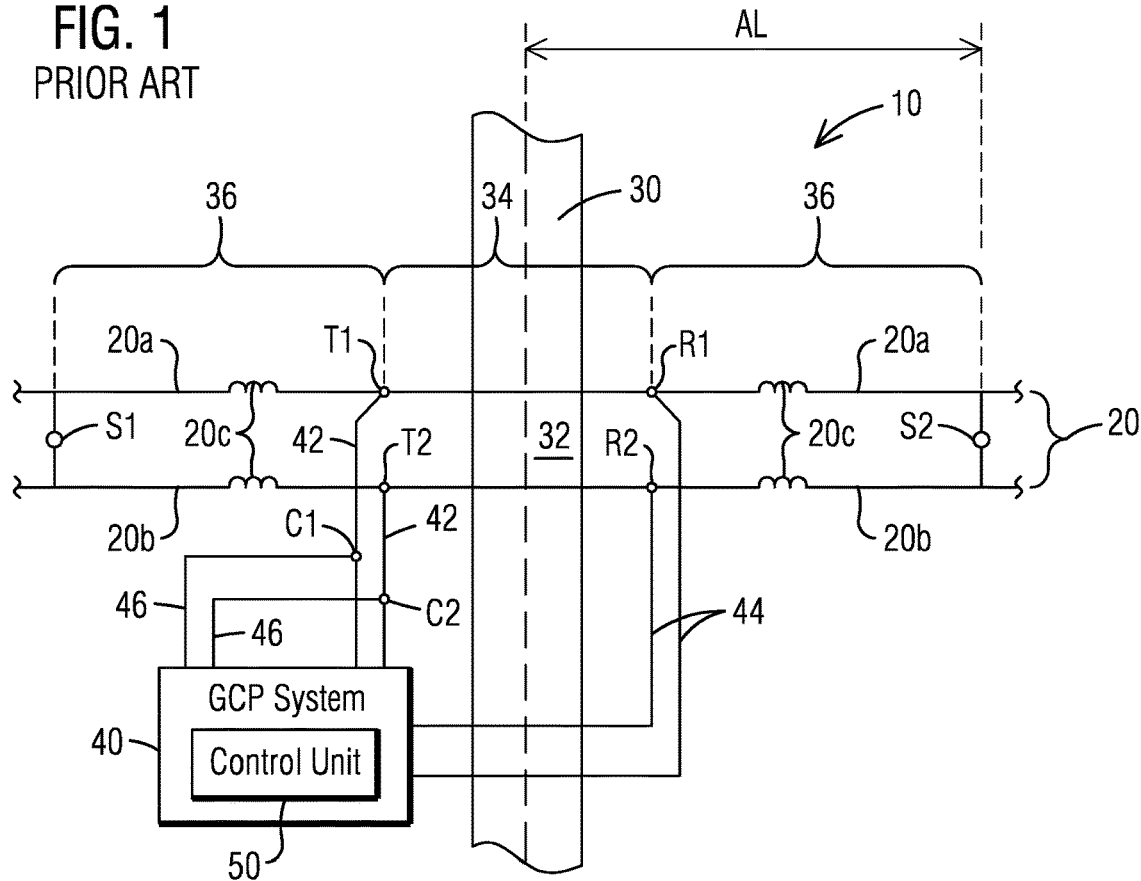
FIG. 1 illustrates an example railroad crossing control system in accordance with an embodiment disclosed herein.

FIG. 1 illustrates a known railroad crossing control system 10 in accordance with a disclosed embodiment. Road 30 crosses a railroad track 20. The crossing of the road 30 and the railroad track 20 forms an island 32. The railroad track 20 includes two rails 20a, 20b and a plurality of ties (not shown in FIG. 1) that are provided over and within railroad ballast (not shown in FIG. 1) to support the rails 20a, 20b. The rails 20a, 20b are shown as including inductors 20c. The inductors 20c, however, are not separate physical devices but rather are shown to illustrate the inherent distributed inductance of the rails 20a, 20b.

The system 10 includes a constant warning time device 40, herein also referred to as grade crossing predictor (GCP) or GCP system 40, which comprises a transmitter that connects to the rails 20a, 20b at transmitter connection points T1, T2 on one side of the road 30 via transmitter wires 42. The constant warning time device 40 also comprises a main receiver that connects to the rails 20a, 20b at main receiver connection points R1, R2 on the other side of the road 30 via receiver wires 44. The receiver wires 44 are also referred to as main channel receiver wires. The constant warning time device 40 further comprises a check receiver that connects to the rails 20a, 20b at check receiver connection points C1, C2 via check channel receiver wires 46. The check channel receiver wires 46 are connected to the track 20 on the same side of the road 30 as the transmitter wires 42, resulting in a six-wire system. The main channel receiver and check channel receiver operate in much the same manner with an incoming train move, providing a parallel check of the main channel operation. Those of skill in the art will recognize that the transmitter and receivers (main channel receiver and check channel receiver), other than the physical conductors that connect to the track 20, are often co-located in an enclosure located on one side of the road 30.

The GCP system 40 includes a control unit 50 connected to the transmitter and receivers. The control unit 50 includes logic, which may be implemented in hardware, software, or a combination thereof, for calculating train speed, distance and direction, and producing constant warning time signals for the railroad crossing system 10. The control unit 50 can be for example integrated into a central processing unit (CPU) module of the GCP system 40 or can be separate unit within the GCP system 40 embodied as a processing unit such as for example a microprocessor.

Also shown in FIG. 1 is a pair of termination shunts S1, S2, one on each side of the road 30 at a desired distance from the center of the island 32. It should be appreciated that FIG. 1 is not drawn to scale and that both shunts S1, S2 are approximately the same distance away from the center of the island 32. The termination shunts S1, S2, are arranged at predetermined positions corresponding to an approach length AL required for a specific warning time (WT) for the GCP system 40. For example, if a total WT of 35 seconds (which includes 30 seconds of WT and 5 seconds of reaction time of the GCP system 40) at 60 mph maximum authorized speed (MAS) of a train is required, a calculated approach length AL is 3080 feet. Thus, the shunts S1, S2 are arranged each at 3080 feet from the center of the island 32. It should be noted that one of ordinary skill in the art is familiar with calculating the approach length AL. The termination shunts S1, S2 can be embodied for example as narrow band shunts (NBS).

Typically, the shunts S1, S2 positioned on both sides of the road 30 and the associated GCP system 40 are tuned to a same frequency. This way, the transmitter can continuously transmit one AC signal having one frequency, the receiver can measure the voltage response of the rails 20a, 20b and the control unit 50 can make impedance and constant warning time determinations based on the one specific frequency. When a train crosses one of the termination shunts S1, S2, the train's wheels and axles act as shunts, which lower the inductance, impedance and voltage measured by the corresponding control unit 50. Measuring the change in the impedance indicates the distance of the train, and measuring the rate of change of the impedance (or integrating the impedance over time) allows the speed of the train to be determined. FIG. 1 further illustrates an island circuit 34 which is the area between transmitter connection points T1, T2 and main receiver connection points R1, R2. For example, the constant warning time device 40 monitors the island circuit 34 as well as approach circuits 36 which lie to the right and left of the island circuit 34, i.e., between the island circuit 34 and the termination shunts S1, S2.

Figure 2:
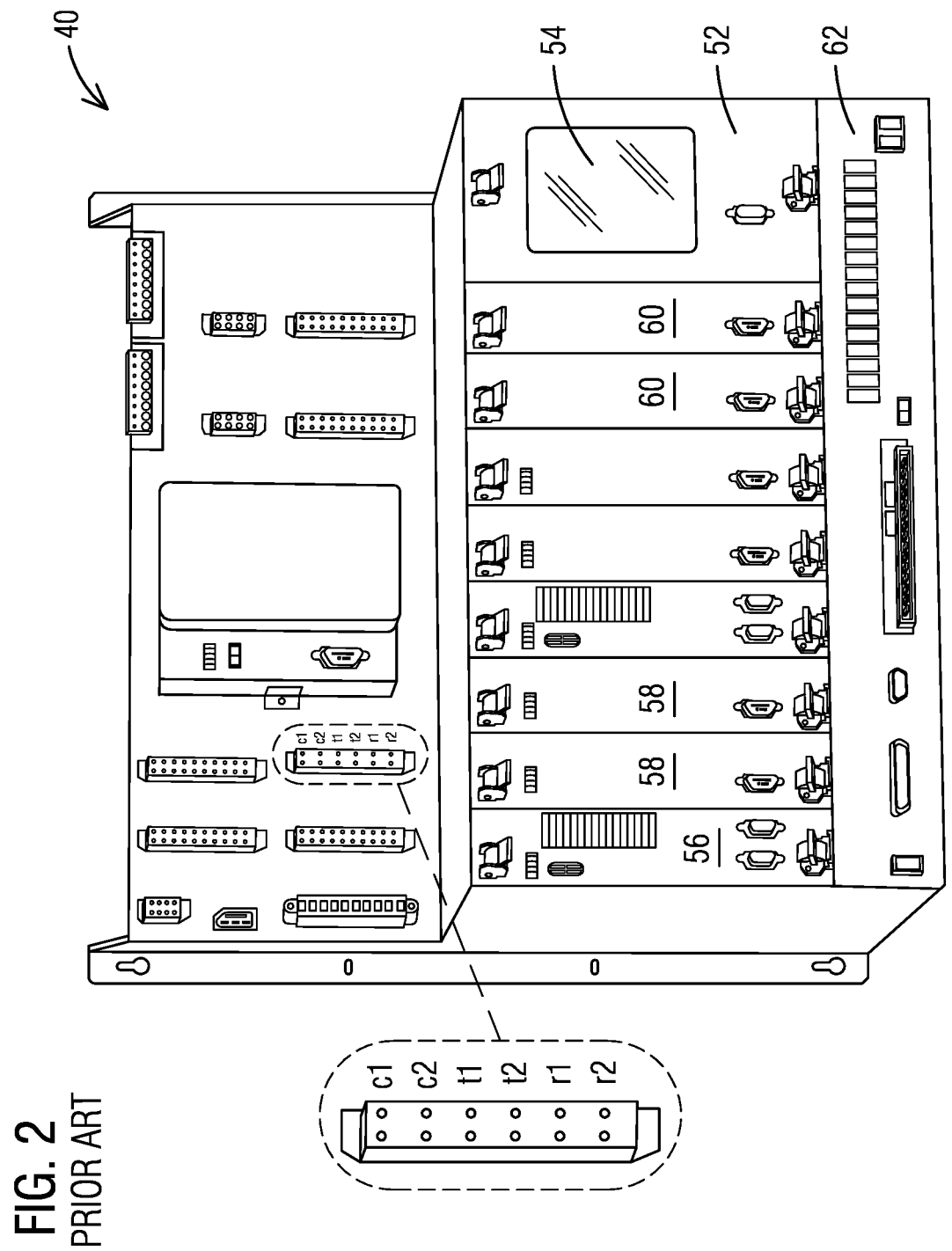
FIG. 2 illustrates an example constant warning time device in accordance with an embodiment disclosed herein.

FIG. 2 illustrates an example constant warning time device (GCP system) 40 in accordance with an embodiment disclosed herein. The GCP system 40 is typically enclosed within a generally weatherproof bungalow or housing and usually in general proximity to at least one of the railroad tracks 20. The GCP system 40 is an integrated system that includes all of the control, train detection, recording and monitoring functions for the railroad crossing control system 10 shown in FIG. 1. The GCP system 40 includes a plurality of modules. One of these modules is for example a display module 52 with a display 54. The display 54 can be a touch screen display that provides a user interface, for example for initial setup, calibration and troubleshooting of the GCP system 40. Other modules may include a central processing unit (CPU) 56, track modules 58 for monitoring each track, crossing control modules 60 for controlling traffic warning gates, and a recorder module 62 including one or more memory units for recording events and conditions at the railroad track system 10. Each of the modules may have external connectors, test points and lighted indicators. For example, each track module 58 comprises transmitter connection pins t1, t2, main receiver connection pins r1, r2, and check receiver connection pins c1, c2.

Figure 3:
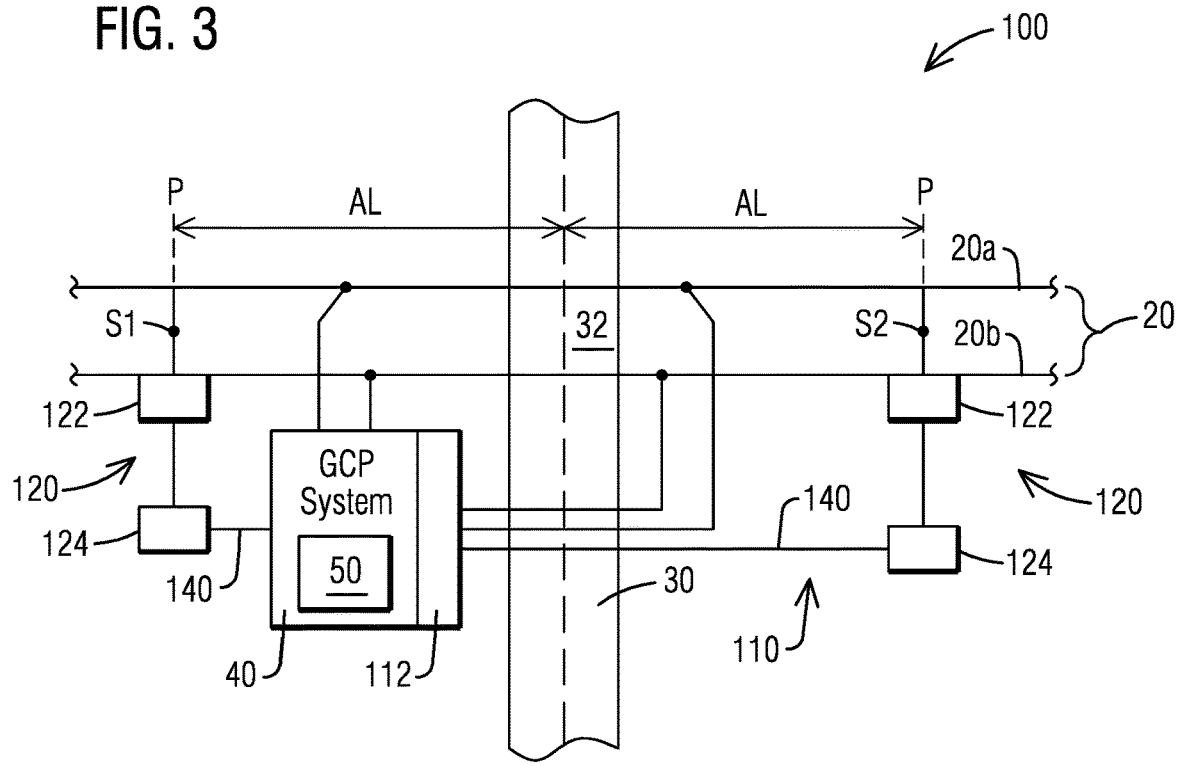
FIG. 3 illustrates a railroad crossing control system including a constant warning time device and an axle counter system in accordance with an exemplary embodiment of the present invention.

FIG. 3 illustrates a railroad crossing control system 100 in accordance with an exemplary embodiment of the present invention comprising a GCP system 40 with control unit 50 for producing constant warning time signals for crossing warning devices. A pair of termination shunts S1, S2 is arranged one on each side of the road 30 at a desired distance from the center of the island 32, wherein the shunts S1, S2 are connected between the rails 20a, 20b of the railroad track 20. The termination shunts S1, S2, are arranged at predetermined positions P corresponding to an approach length AL required for a specific warning time (WT) for the GCP system 40.

As noted before, the termination shunts S1, S2 are mechanical devices connected between the rails 20a, 20b of the railroad track 20. For example, the termination shunts S1, S2 may be secured onto the rails 20a, 20b by clamp-type devices. However, a shunt device may not always be operational after its installation. For example, a shunt device may not be correctly clamped onto the rails, or an onsite worker may trip on a wire on the shunt device and disconnect it from the rails. Further, there is the possibility of a faulty connection or other error of the shunt device due to for example rusty rails or rusty connection elements of the shunts or material fatigue of shunt components.

In accordance with an exemplary embodiment, the railroad crossing control system 100 further comprises an axle counter system 110 comprising a wheel sensing system 120 with trackside connection box 124 and evaluation module 112. In general, an axle counter system detects a passing of a railway vehicle or train travelling on a railroad track between two points. In other words, axle counter systems are used for track vacancy detection—determining if a section of track is currently occupied by a train or other equipment by counting axles into and out of a section block. In addition to detecting the railway vehicle, the system may provide values or signals, such as for example travelling direction and/or speed data of the vehicle.

The wheel sensing system 120 comprises at least one sensor 122, but can comprise one or more sensors 122 which are substantially identical. FIG. 3 shows two sensors 122 arranged at the railroad track 20 at predetermined positions P and physically connected to one of the rails 20a, 20b of the track 20. According to the example illustrated in FIG. 3, the sensors 122 are physically connected to the rail 20b, but the sensors 122 may alternatively be connected to rail 20a. The sensors 122 sense the presence and movement of metallic wheels of railcars of a railroad vehicle travelling on the track 20. But the sensors 122 do not have an electrical connection to the rail 20b (or 20a) or the track structure 20.

At least one sensor 122 is arranged on each side of the road 30 at a predetermined distance from the center of the island 32. In particular, the sensors 122 are placed at a position corresponding to the position of the termination shunts S1, S2. In other words, the sensors 122 are arranged at the predetermined positions P corresponding to the approach length AL required for a specific warning time (WT) for the GCP system 40. According to the example of FIG. 3, the wheel sensing system 120 comprises two sensors 122 arranged one on each side of the road 30 at a desired distance from the center of the island 32, in particular corresponding to the approach length AL. In case of more than one sensor 122, the multiple sensors 122 would be arranged in series and next to each other and physically connected to one of the rails 20a, 20b.

Each sensor 122 is operably connected to a trackside connection box 124. The trackside connection box 124 is located in proximity to the one or more sensors 122 and provides a power supply to the one or more sensors 122, for example via cables. FIG. 3 illustrates two trackside connection boxes 124 arranged on either side of the island 32 and assigned to the sensor 122 on the respective side of the island 32. But both sensors 122 could be connected to a single trackside connection box 124.

The trackside connection box 124 is further adapted to receive signals supplied by the sensor(s) 122 and transmits the signals to the evaluation module 112. The evaluation module 112 is in communication with the trackside connection box 124 and is adapted to receive and process the signals provided or measured by the wheel sensing system 120 and the trackside connection box 124 and to count axles based on detection of the wheels of the railroad vehicle and to generate an indication that the railroad track 20 is clear or occupied. The evaluation module 112 can be further adapted to provide direction information of the railroad vehicle.

A communication network 140 interfaces with the evaluation module 112 and the trackside connection box 124, and is adapted to transmit data between the trackside connection box 124 and the evaluation module 112. Specifically, the trackside connection box 124 feeds data into the evaluation module 112 via the communication network 140. The sensors 122 measure or obtain at least speed values of a railroad vehicle when the railroad vehicle passes the sensors 122 connected to one of the rails 20a, 20b. The trackside connection box 124 receives and records the speed data and provides these data to the evaluation module 112. The axle counter system 110 and wheel sensing system 120 with trackside connection box 124 will be described in more detail with reference to FIG. 4.

With further reference to FIG. 3 and according to an exemplary embodiment, the evaluation module 112 and the constant warning time device 40 comprise a common hardware platform. The evaluation module 112 can be configured in hardware and/or software. By sharing a common platform, the evaluation module 112 can be in communication and utilize other modules and functionalities of the GCP system 40 (see also FIG. 2) for example for data processing or data displaying. For example, the evaluation module 112 can be configured as a plug in module of the constant warning time device 40. In another embodiment, the evaluation module 112 can be configured in software and can be integrated into the constant warning time device 40.

The GCP system 40 is in communication with the axle counter system 110, in particular the evaluation module 112 and wheel sensing system 120 and utilizes the data and information obtained and provided by the axle counter system 110 for producing signals, in particular constant warning time signals for railroad crossing warning devices. For example, the control unit 50 of the GCP system 40 can be part of the CPU module 56 (see FIG. 2) of the GCP system 40. The control unit 50 and/or the CPU module 56 comprise(s) prediction logic, which may be implemented in hardware, software, or a combination thereof, for example for producing constant warning time signals for the railroad crossing system 10. The data, in particular the speed values, of the wheel sensing system 120 are fed into the prediction logic built into the GCP system 40.

The railroad crossing control system 100 as illustrated in FIG. 3 comprises the termination shunts S1, S2 as well as the sensors 122 of the wheel sensing systems 120, i.e. the termination shunts S1, S2 and sensors 122 (wheel sensing system 120) are installed in parallel. Alternatively, the control system 100 may only comprise the wheel sensing system 120 with sensor 122, and not comprise the termination shunts S1, S2.

The axle counter system 110 is provided and installed in combination with the GCP system 40 to provide a reliable and safe railroad crossing control system 100 that includes additional, integrated functionalities of both systems. As noted before, the termination shunts S1, S2 may not always be operational after installation. Further, there is the possibility of a faulty connection or other error of the shunt device due to for example rusty rails or rusty connection elements of the shunts or material fatigue of shunt components. The wheel sensing system 120 with one or more sensors 122 installed in parallel to the termination shunts S1, S2, or installed instead of the shunts S1, S2, detects presence of a railway vehicle and provides necessary information and data of the railway vehicle to the GCP system 40. Thus, in case the termination shunts S1, S2 are not operational (or not installed), the wheel sensing system 120 obtains and provides the necessary information of an approaching railroad vehicle in order to activate a railroad crossing. Further, since the wheel sensing system 120 is electrically isolated from the rail track 20, the need for lower crossing approach frequencies and longer crossing approaches (which the GCP system 40 alone may require) are eliminated. Providing a link between the wheel sensing system 120 (and axle counter system 110) and the GCP system 40 minimizes extra equipment that would be needed to provide the longer crossing approaches for a GCP system 40. Furthermore, adding the axle counter system 110 as an integrated option to the constant warning time device 40 allows for expansion of the system functionality to use audio frequency track circuits, wheel sensing system 120 with sensors 122 or both technologies in a common hardware platform.

Figure 4:
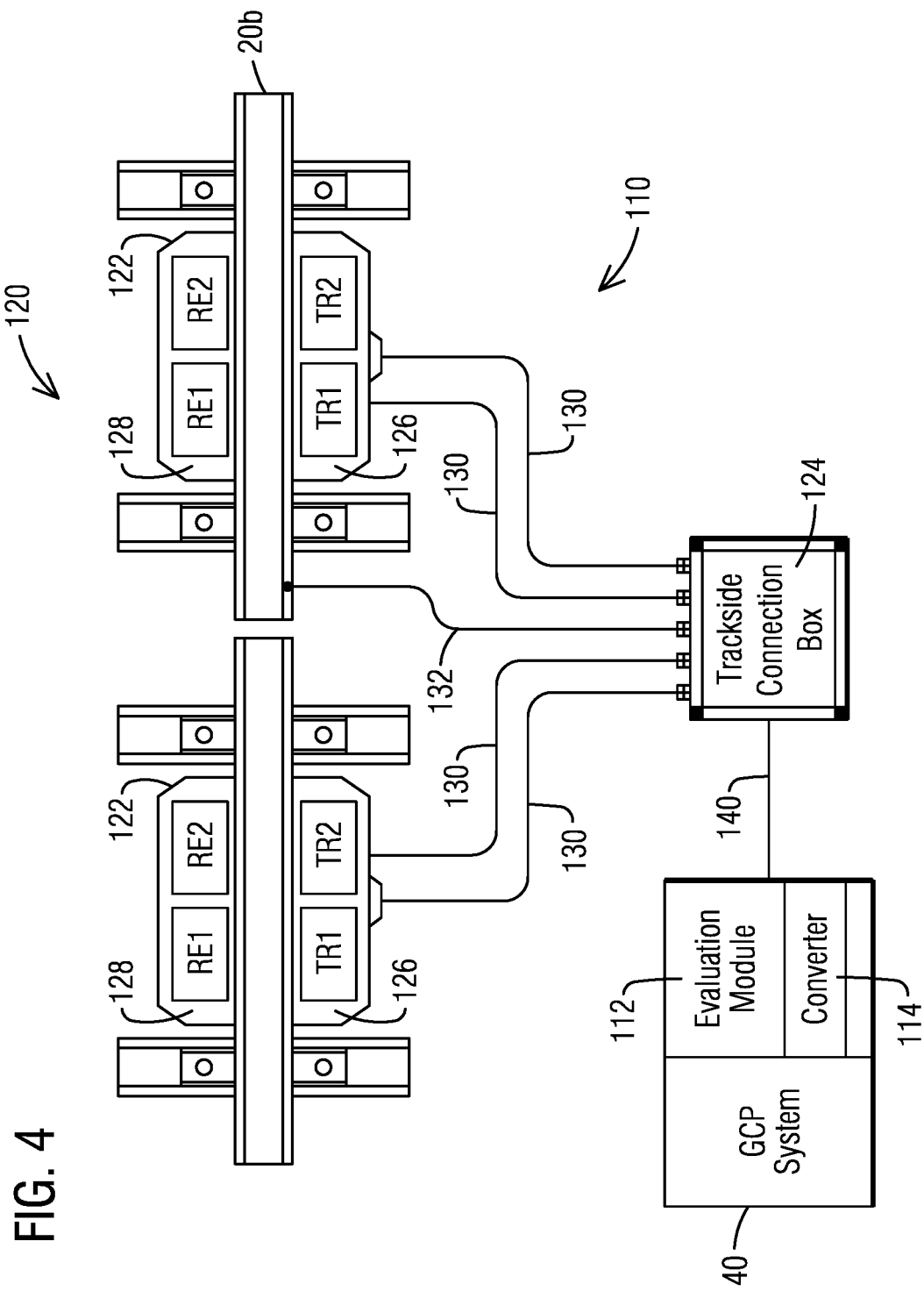
FIG. 4 illustrates an axle counter system with wheel sensing system and evaluation unit for a railroad crossing control system in accordance with an exemplary embodiment of the present invention.

FIG. 4 illustrates an axle counter system 110 with wheel sensing system 120 and evaluation module 112 for a railroad crossing control system 100 in accordance with an exemplary embodiment of the present invention. As described before, the wheel sensing system 120 comprises one or more sensors 122 and one or more trackside connection boxes 124. The embodiment as described in FIG. 4 includes two sensors 122 and one trackside connection box 124, wherein the two sensors 122 are identical and connected to the trackside connection box 124.

Each sensor 122 comprises two electronic sensing units, wherein each sensing unit comprises a transmitter TR1, TR2 and a receiver RE1, RE2. Both transmitters TR1, TR2 are accommodated in a transmitter housing 126, and both receivers RE1, RE2 are accommodated in a receiver housing 128. The transmitter housing 126 including the transmitters TR1, TR2 and the receiver housing 128 including the receivers RE1, RE2 are physically coupled to one of the rails 20a, 20b (in this example rail 20b), wherein the transmitter housing 126 and the receiver housing 128 are positioned on opposite sides of the rail 20b, so that a receiver RE1, RE2 is positioned opposite a transmitter TR1, TR2. The housings 126, 128 including transmitters TR1, TR2 and receivers RE1, RE2 are detachably coupled to the rail 20b via bolts or screws, in particular to a rail web of the rail 20b.

Each sensor 122 operates based on electromagnetic wheel detection. The transmitters TR1, TR2 produce alternating magnetic fields of a specific frequency. The receivers RE1, RE2 comprise for example solenoids or coils, wherein the magnetic fields generated by the transmitters TR1, TR2 induce voltages in the receivers RE1, RE2. Based on the induced voltages, the receivers RE1, RE2 provide signals. When a metallic wheel of a rail vehicle enters the alternating magnetic fields, intensities of the magnetic fields change and consequently the induced voltages and the signals based on the induced voltage in the receivers RE1, RE2 change. The signals of the receivers RE1, RE2 are transmitted to the trackside connection box 124. The receivers RE1, RE2 and the transmitters TR1, TR2 are operably coupled to the trackside connection box 124 via connections 130, for example cables. The system further comprises ground cable 132 directly coupled to the rail 20b. Based on the signals of the receivers RE1, RE2 in combination with a defined distance between the transmitters TR1, TR2 and receivers RE1, RE2 and time difference when the wheels of a rail vehicle pass the transmitters TR1, TR2 and receivers RE1, RE2, the trackside connection box 124 determines the actual speed of the rail vehicle. The trackside connection box 124 is operably coupled to the evaluation module 112 which interfaces with the GCP system 40, wherein the GCP system 40 uses the speed signals for producing signals, such as for example constant warning time signals.

The axle counter system 110, in particular the evaluation module 112, may require a power supply which is different than a power supply of the GCP system 40. For example, the axle counter system 110 may require a 24V direct current (DC) negative grounded power supply, while the GCP system 40 operates using a 12V DC power supply. A 24V DC negative grounded power supply is an unusual voltage requirement in North America and Federal Railroad Administration (FRA) regulations require signal equipment batteries to be ground-free requiring the addition of isolating converters. Thus, it is desirable to combine the axle counter system 110 with the GCP system 40 so that the axle counter system 110 with evaluation module 112 is operating using the permitted power supply of the GCP system 40, for example 12V DC power supply. A DC-to-DC converter 114 can be provided integrated into the evaluation module 112 and/or GCP system 40 converting the DC power supply of the GCP system 40 from a first voltage level to a second voltage level for operating the evaluation module 112. Alternatively, the evaluation module 112 may be adapted such that it is functional using the power supply of the GCP system 40 and no converter is required. Further, the axle counter system 110 may not have capability of logging history or event sequences to any type of memory that can be read after the fact which makes incident recreation and troubleshooting relatively complicated. By integrating the axle counter system 110 with evaluation module 112 into the GCP system 40, a memory, which is the memory of the GCP system 40, is provided and can be utilized by both systems.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

The invention claimed is:
1. A railroad crossing control system comprising:
a constant warning time device with a control unit configured to produce multiple signals, and
a wheel sensing system comprising at least one sensor connected to a rail of a railroad track at a predetermined position,
wherein the wheel sensing system detects a presence of railroad vehicle travelling on the railroad track such that the at least one sensor detects wheels of the railroad vehicle using electromagnetic fields,
wherein the wheel sensing system provides speed values of the railroad vehicle to the constant warning time device,
wherein the constant warning time device produces a constant warning time signal for controlling a railroad crossing warning device in response to receiving the speed values of the wheel sensing system, and
wherein the railroad crossing control system further comprises:
an evaluation module in communication with the wheel sensing system, wherein the evaluation module is adapted to count axles based on detection of the wheels of the railroad vehicle and to generate an indication that the railroad track is clear or occupied, and
a converter, wherein the converter converts a direct current power supply of the constant warning time device from a first voltage level to a second voltage level for operating the evaluation module.

2. The railroad crossing control system of claim 1, wherein the control unit of the constant warning time device comprises prediction logic to activate the railroad crossing warning device in response to receiving the speed value of the wheel sensing system.

3. The railroad crossing control system of claim 1, wherein the predetermined position of the at least one sensor corresponds to an approach length required for activation of the crossing warning device in accordance with a warning time of the railroad vehicle travelling on the railroad track, the approach length being determined at maximum authorized speed of the railroad vehicle.

4. The railroad crossing control system of claim 1, wherein the evaluation module is further adapted to provide direction information of the railroad vehicle.

5. The railroad crossing control system of claim 1, wherein the evaluation module and the constant warning time device comprise a common hardware platform.

6. The railroad crossing control system of claim 5, wherein the evaluation module is configured as software and hardware.

7. The railroad crossing control system of claim 1, wherein the evaluation module and the constant warning time device comprise a common power supply.

8. The railroad crossing control system of claim 1, wherein the evaluation module is integrated into the constant warning time device.

9. The railroad crossing control system of claim 8, wherein the evaluation module is configured as software.

10. The railroad crossing control system of claim 1, wherein the at least one sensor comprises transmitters and receivers, wherein the electromagnetic fields between the transmitters and receivers change when the wheels of the railroad vehicle pass through the electromagnetic fields.

11. The railroad crossing control system of claim 1, wherein the wheel sensing system further comprises a trackside connection box operably coupled to the at least one sensor, the trackside connection box providing and transmitting the speed values to the constant warning time device.

12. The railroad crossing control system of claim 1, wherein the wheel sensing system comprises multiple sensors arranged in series and connected to a rail.

13. The railroad crossing control system of claim 1, wherein the control system comprises multiple wheel sensing systems, wherein sensors of the wheel sensing systems are connected to a rail of the railroad track at predetermined positions on opposite sides of an island of a railroad crossing.

* * * * *